United States Patent [19]

Uchida

[11] Patent Number: 5,148,121
[45] Date of Patent: Sep. 15, 1992

[54] AMPLIFIER CIRCUIT DESIGNED FOR USE IN A BIPOLAR INTEGRATED CIRCUIT, FOR AMPLIFYING AN INPUT SIGNAL SELECTED BY A SWITCH CIRCUIT

[75] Inventor: Noriaki Uchida, Yokohama, Japan

[73] Assignee: Kabushiki Kaisha Toshiba, Kanagawa, Japan

[21] Appl. No.: 688,495

[22] PCT Filed: Oct. 11, 1990

[86] PCT No.: PCT/JP90/01311
§ 371 Date: Jun. 10, 1991
§ 102(e) Date: Jun. 10, 1991

[30] Foreign Application Priority Data

Oct. 11, 1989 [JP] Japan .................................. 1-263114

[51] Int. Cl.⁵ ............................................. H03F 3/68
[52] U.S. Cl. ........................................ 330/295; 307/243;
328/104; 328/154; 330/147
[58] Field of Search ................ 330/51, 85, 147, 124 R,
330/254, 295; 307/243; 328/104, 154

[56] References Cited

U.S. PATENT DOCUMENTS 4,572,967 2/1986 Metz ............................. 328/104 X

FOREIGN PATENT DOCUMENTS 53-86316 5/1984 Japan .
1-179512 7/1989 Japan .
1-180108 7/1989 Japan .
2-134006 5/1990 Japan .

Primary Examiner—James B. Mullins
Attorney, Agent, or Firm—Finnegan, Henderson, Farabow, Garrett and Dunner

[57] ABSTRACT

An amplifier circuit having a switch (SW), wherein the switch selects one of a plurality of input voltage-to-current converting amplifiers (GM1 to GMn), and the input amplifier, thus selected, converts an input signal into a current. This current is added to a feedback signal current. Hence, even if the signals input to the voltage-to-current converting amplifiers have different DC potentials, the DC potential difference does not appear in the output. The DC potential of the output signal of the amplifier circuit is determined by the reference voltage ($V_{REF}$) of a feedback voltage-to-current amplifier ($GM_{NF}$) and hence remains constant at all times.

3 Claims, 3 Drawing Sheets

AMPLIFIER CIRCUIT DESIGNED FOR USE IN A BIPOLAR INTEGRATED CIRCUIT, FOR AMPLIFYING AN INPUT SIGNAL SELECTED BY A SWITCH CIRCUIT

TECHNICAL FIELD

The present invention relates to an amplifier circuit which has a switch and a plurality of amplifiers, each designed to amplify an input signal when selected by operating the switch, and more particular to an amplifier circuit having a switch, which is designed for use in a bipolar integrated circuit.

BACKGROUND ART

A conventional amplifier circuit having a switch has the structure shown in FIG. 1. QA0 and QB0 are mute-mode NPN transistors which have their emitters connected together, thus forming a mute-mode differential pair. QA1 and QB1, QA2 and QB2, . . . QAn and QBn are input NPN transistors, every two of which have their emitters coupled together, thus forming an input differential pair. The input transistors QA1, QA2, . . . QAn have their collectors connected together, forming a node (the node being denoted by A). The input transistors QB1, QB2, . . . QBn have their collectors connected together, forming a node (the node being denoted by B).

The bases of the input transistors QA to QAn are connected to a reference voltage terminal $V_{REF}$ by input-biasing resistors R1 to Rn, respectively, and are also connected to input terminals IN1 to INn, respectively. The bases of the input transistors QB1 to QBn are connected to a negative feedback terminal NF.

The base of the mute-mode transistor QA0 is connected to the reference voltage terminal $V_{REF}$. The base of the transistor QB0 is coupled to the negative feedback terminal NF.

The circuit has a switch SW which can be connected to, and thus selects, the emitter node of the mute-mode transistors QA0 and QB0, that of the input transistors QA1 and QB1, that of the input transistors QA2 and QB2, that of the input transistors QAn and QBn, or that of the two input transistors forming any other intervening pair. A constant-current source I1 is connected between the selected emitter node and the ground potential terminal GND.

The collectors of NPN transistors Q1 and Q2, which form a current mirror, are connected to the nodes A and B, respectively. A resistor RE1 is connected between the emitter of the transistor Q1 and the a Vcc power-supply terminal. A resistor RE2 is connected between the emitter of the transistor Q2 and the Vcc power-supply terminal. The node B is connected to an output terminal OUT by an emitter follower circuit composed of an NPN transistor Q3 and a constant-current source I2 connected to the emitter of the transistor Q3. A feedback circuit comprised of resistors RNF1 and RNF2 and a capacitor CNF is connected between the output terminal OUT and the negative feedback terminal NF.

Input terminals IN1 to INn are coupled to input-signal sources S1 to Sn by coupling capacitors C1 to Cn, respectively.

In the amplifier circuit described above, which has the switch SW, the input-transistors pairs (QA1, QB1), (QA2, QB2), . . . (QAn, QBn) amplify the input signals input from the input-signal sources S1 to Sn to the input terminals IN1 to INn. The output of the input-transistor pair, which has been selected by the switch SW, is supplied to the output terminal OUT via the emitter follower circuit. The gain GV of the amplifier circuit having the switch SW is determined by the constant of the feedback circuit, as is represented by the following equation:

$$GV = (RNF1 + RNF2)/RNF1 \quad (1)$$

When the switch SW selects the mute-mode transistor pair (QA0, QB0), the gain GV is "0," and no outputs will be supplied from the amplifier circuit.

As has been described, the amplifier circuit has coupling capacitors C1 to Cn and an input-biasing resistors R1 to Rn. These elements are used for the purpose of preventing the DC potential of the output signal from changing when the switch SW is changed over. Were the input signals input directly to the bases of the input transistors QA1 to QAn, the DC potential of the output signal would vary when the switch SW is changed over if the DC potentials V1 to Vn of the input signals are different. The use of the coupling capacitors C1 to Cn and the input-biasing resistors R1 to Rn, however, means an increase in the number of elements forming the amplifier circuit.

Further, to form a mute-mode pair, the mute-mode transistors QA0 and QB0 are indispensable.

The gain GV of the amplifier circuit having the switch SW is set at a fixed value. In other words, it cannot be set at any value suitable for each input signal.

The conventional amplifier circuit having a switch has three problems. First, it comprises many elements. Second, it needs two mute-mode transistors for constituting a mute-mode pair. Third, its gain cannot be individually set for each input signal.

The present invention has been made in order to solve the problems described above. Its object is to provide an amplifier circuit having a switch, which comprises a relatively small number of elements, can have a gain individually set for each input signal, and can operate in mute mode without requiring mute-mode transistors.

DISCLOSURE OF THE INVENTION

According to the present invention, there is provided an amplifier circuit which comprises a plurality of input voltage-to-current converting amplifiers, an adder circuit, a current-to-voltage converting amplifier, a feedback voltage-to-current converting amplifier, and a switch. Each of the input voltage-to-current amplifiers has two input terminals, one of which is coupled to an input-signal source having a DC potential source, and the other of which is connected to the DC potential source. These amplifiers have output terminals connected together, and are applied with different DC voltages from the DC potential sources. The current output flowing at the node of the output terminals of these amplifiers is supplied to one input terminal of the adder circuit. The current output by the adder circuit is supplied to the current-to-voltage converting amplifier. The output by the current-to-voltage converting amplifier is applied via a feedback circuit to one input terminal of the feedback voltage-to-current converting amplifier circuit. A reference potential is applied to the other input terminal of the feedback voltage-to-current converting amplifier circuit. The current output by the feedback voltage-to-current converting amplifier is supplied to the other input terminal of the adder circuit. The switch is operated to select and connects one of the input voltage-to-current amplifiers to an operation current source.

In the amplifier circuit described above, the one of the input voltage-to-current amplifiers is selected by operating the switch, the selected voltage-to-current converting amplifier converts an input signal to a current, and the current, thus obtained, is added to a feedback-signal current. Hence, although the signals input to the voltage-to-current converting amplifiers have different DC potentials, the DC potential difference does not appear in the output when any of these amplifier is switched to another by means of the switch. As a result, the DC potential of the output signal of any amplifier selected is determined by only the reference potential applied to the feedback voltage-to-current converting amplifier circuit, and therefore remains unchanged at all times.

The input voltage-to-current converting amplifiers can have gains respectively set for input signals, merely by imparting different transfer conductances gm to the input amplifiers.

When the switch selects none of the input voltage-to-current converting amplifiers, the gains for the signals input to these amplifiers are zero, and the amplifier circuit is set in the mute mode. While the circuit remains in the mute mode, the DC output potential of the circuit is equal to the reference voltage applied to the feedback voltage-to-current converting amplifier, whereby there are no changes in the output voltage.

DESCRIPTION OF THE PREFERRED EMBODIMENTS

An embodiment of the present invention will now be described in detail, with reference to the accompanying drawings.

Figure 2:
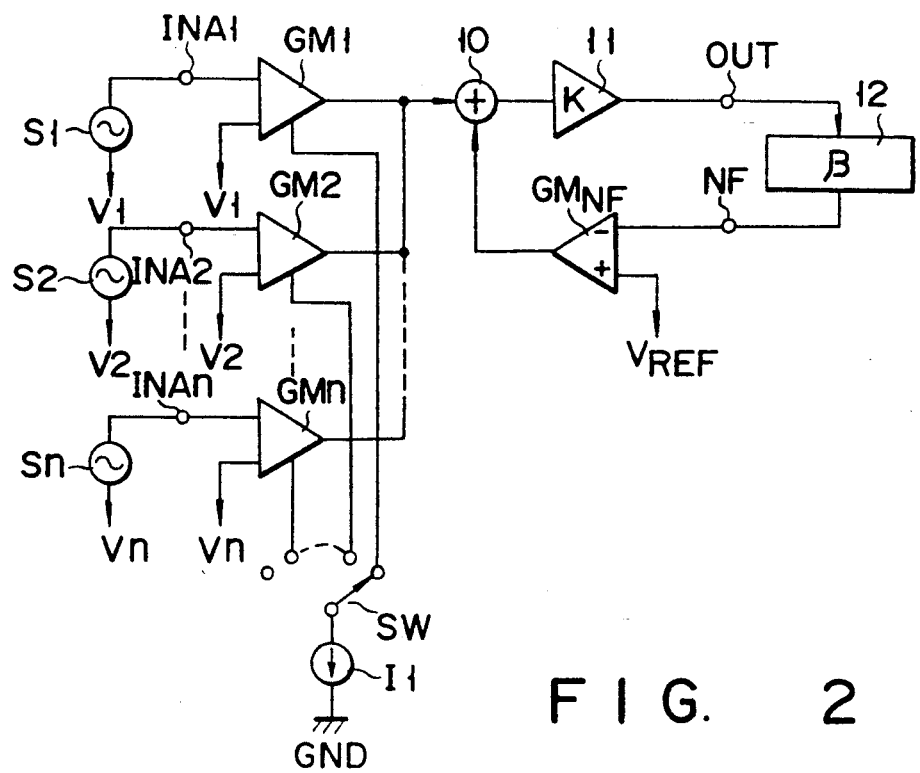
FIG. 2 is a block diagram representing the basic structure of an amplifier circuit having a switch, according to the present invention.

FIG. 2 shows the basic structure of an amplifier circuit having a switch, according to the present invention. INA1 to INAn designate input terminals connected to input-signal sources S1 to Sn which have DC potentials V1 to Vn, respectively. GM1 to GMn denote input voltage-to-current converting amplifiers for receiving, at one input terminal, input signals from the input terminals INA1 to INAn and amplifying these input signals. The amplifiers GM1 to GMn receive, at the other input terminal, reference voltages V1 to Vn which are equal to the DC potentials V1 to Vn of the input-signal sources S1 to Sn. One of the input amplifiers GM1 to GMn is selected by a switch SW and is thereby connected to an operation-current source I1. The current output by the selected input amplifier is supplied to one input terminal of an adder circuit 10. A current-to-voltage converter circuit 11 having a current-to-voltage conversion gain K converts the output current of the adder circuit 10 into a voltage, which is supplied to an output terminal OUT. A feed back circuit 12 having a feedback ratio $\beta$ is connected between the output terminal OUT and a negative feedback terminal NF. The output voltage of the converter circuit 11 is applied to the inverting input terminal (−) of a feedback amplifier $GM_{NF}$ through the feedback circuit 12 and the negative feedback terminal NF. A reference voltage $V_{REF}$ is applied to the non-inverting input terminal (+) of the amplifier $GM_{NF}$. The current output by the amplifier $GM_{NF}$ is supplied to the other input terminal of the adder circuit 10.

In the amplifier circuit having a switch, the switch SW selects one of the input amplifier circuits GM1 to GMn, the input signal of the input amplifier selected is converted into a current, and the current thus obtained is added to the current output by the feedback amplifier $GM_{NF}$. Hence, although the signals input to the input amplifiers GM1 to GMn have different DC potentials V1 to Vn, the difference among the DC potentials V1 to Vn does not influence the output currents of these amplifiers when any of these amplifier is switched to another by the switch SW. As a result, the DC potential of the output signal of any amplifier selected is determined by only the reference potential $V_{REF}$ applied to the feedback amplifier $GM_{NF}$, and therefore remains unchanged at all times.

Hence, input signals can be directly input to the input amplifiers GM1 to GMn. Unlike the conventional amplifier circuit shown in FIG. 1, the amplifier circuit needs neither elements equivalent to the coupling capacitors C1 to Cn nor element equivalent to the input-biasing resistors R1 to Rn. Thus, the amplifier circuit of the invention comprises a very small number of elements.

In addition, the input amplifiers GM1 to GMn can have different gains for input signals, respectively, merely by imparting different transfer conductances gm to the input amplifiers.

Further, when the switch SW selects none of the input amplifiers GM1 to GMn, the gains for the signals input to these amplifiers are zero, and the amplifier circuit is set in the mute mode. While the circuit remains in the mute mode, the DC output potential of the circuit is equal to the reference voltage $V_{REF}$ applied to the feedback amplifier $GM_{NF}$, whereby there are no changes in the output voltage.

Figure 1:
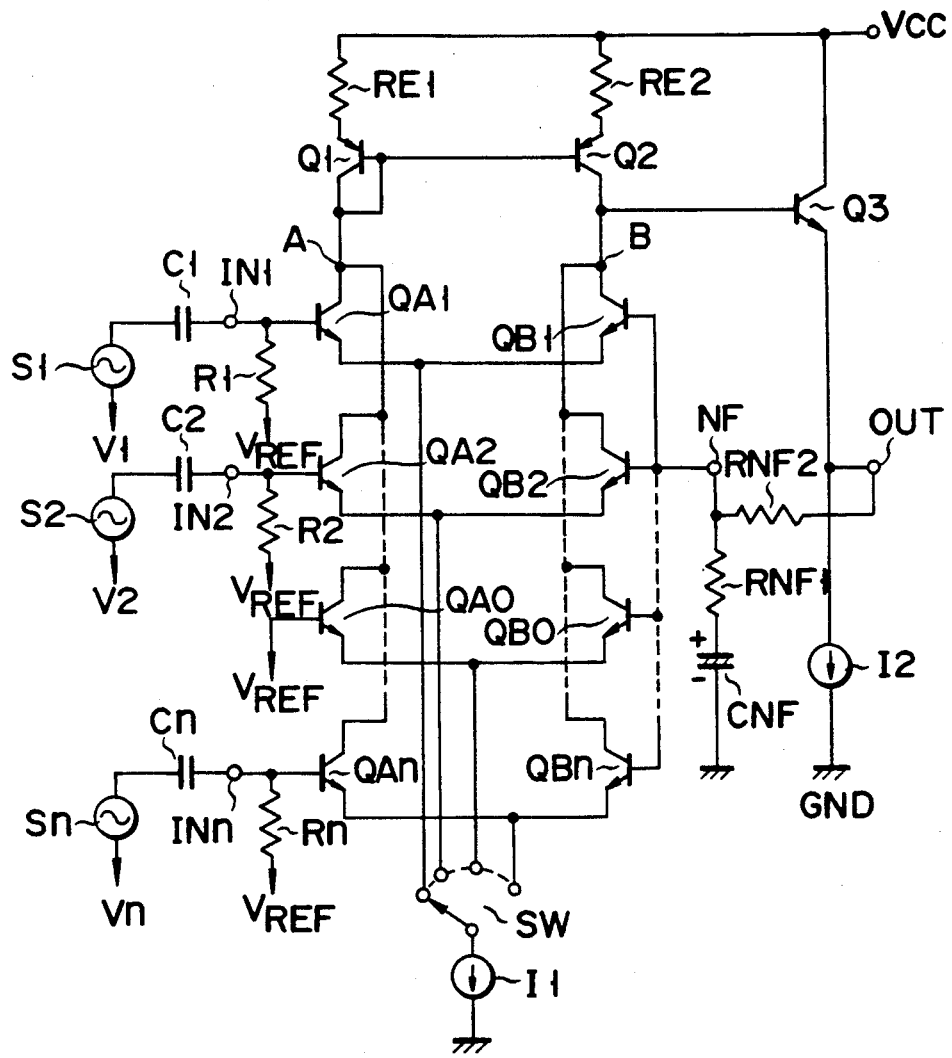
FIG. 1 is a circuit diagram showing a conventional amplifier circuit having a switch.

Hence, the amplifier circuit need not have elements corresponding to the mute-mode transistors (QA0, QB0) which are indispensable to the conventional amplifier circuit shown in FIG. 1.

Figure 3:
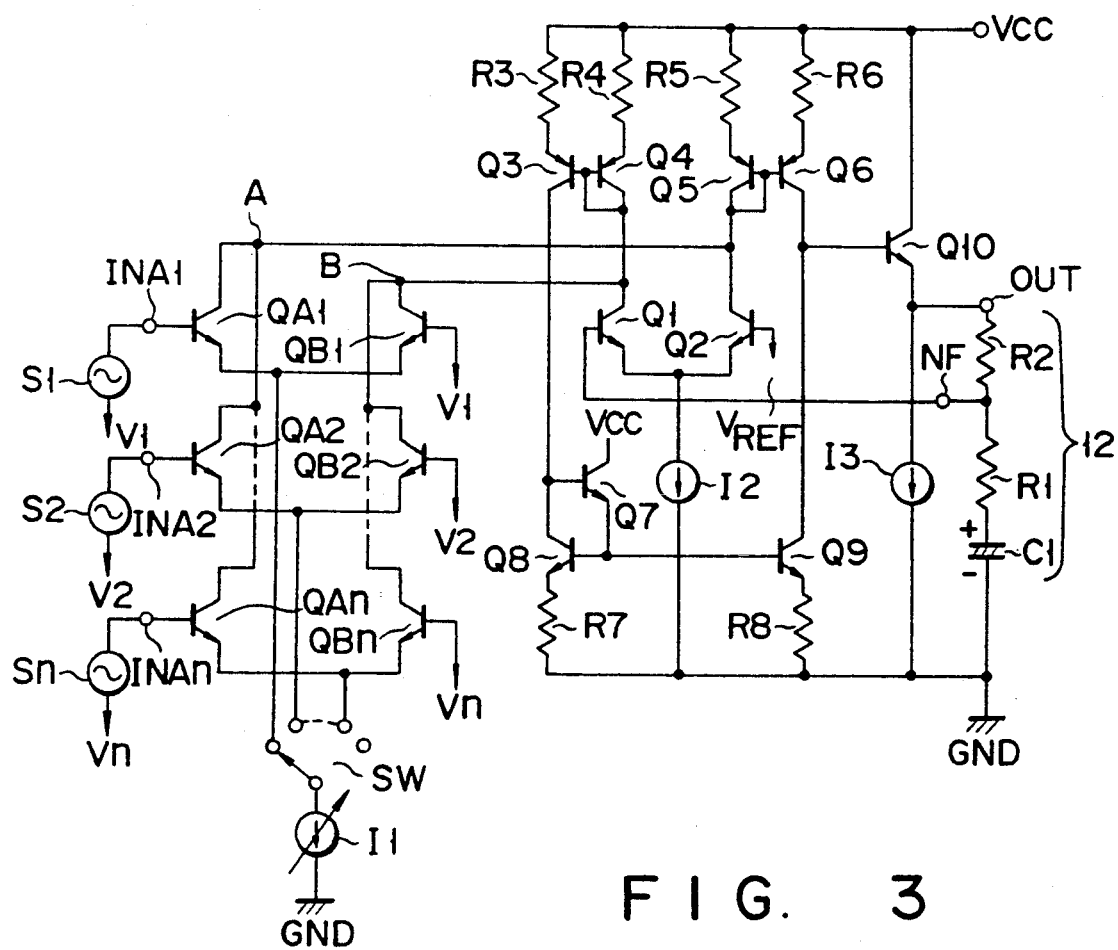
FIG. 3 is a circuit diagram illustrating an embodiment of the amplifier circuit shown in FIG. 2.

FIG. 3 shows an embodiment of the amplifier having a switch, which is illustrated in FIG. 2. QA1 and AB1, QA2 and QB2, ... QAn and QBn are input NPN transistors, every two of which have their emitters coupled together, thus forming an input differential pair. The pairs of NPN transistors, thus formed, are the input amplifiers GM1 to GMn. The input transistors QA1, QA2, ... QAn have their collectors connected together, forming a node (the node being denoted by A). The input transistors QB1, QB2, ... QBn have their collectors connected together, forming a node (the node being denoted by B). The emitters of the input transistors forming each pair, (i.e., QA1, QB1; QA2, QB2; ... QAn, QBn) are connected to each other, thus forming a node. The switch SW is operated, selecting the emitter node of one of the input-transistor pairs. The variable constant-current source I1 is connected between the selected emitter node and the ground potential terminal GND. The bases of transistors QA1 to QAn are coupled to the input terminals INA1 to INAn, respectively. The reference voltages V1 to Vn are applied to the bases of the transistors QB1 to QBn, respectively. The input terminals INA1 to INAn are connected to the input-signal sources S1 to Sn having the DC potentials V1 to Vn, respectively.

A resistor R4 and the emitter-collector path of an PNP transistor Q4 are connected between a Vcc power-supply terminal and the node B. The base and collector of the PNP transistor Q4 are connected together. The base of a PNP transistor Q3 is coupled to the base of the PNP transistor Q4. A resistor R3 is connected between the emitter of the transistor Q3 and the Vcc power-supply terminal. These resistors R4 and R3 and the transistors Q4 and Q3 constitute a first current mirror circuit. Similarly, a resistor R5 and the emitter collector path of a PNP transistor Q5 are connected between the Vcc power-supply terminal and the node A. The base and collector of the PNP transistor Q5 are connected to each other. The base of a PNP transistor Q6 is coupled to the base of the transistor Q5. A resistor R6 is coupled between the emitter of the transistor Q6 and and Vcc power-supply terminal. The resistors R5 and R6 and the transistors Q5 and Q6 constitute a second current mirror circuit.

The collector-emitter path of an NPN transistor Q8 and a resistor R7 are connected between the collector of the transistor Q3 and the ground potential terminal GND. The collector and base of this transistor Q8 are connected to the base and emitter of an NPN transistor Q7, respectively. The collector of the transistor Q7 is coupled to the Vcc power-supply terminal. The collector-emitter path of an NPN transistor Q9 and a resistor R8 are connected between the collector of the transistor Q6 and the ground potential terminal GND. The base of the transistor Q9 is coupled to the base of the transistor Q8. The transistors Q7 to Q9 and the resistors R7 and R8 constitute a third current mirror circuit.

The collector output of the transistor Q6 is connected to the output terminal OUT by the emitter follower circuit which comprises an NPN transistor Q10 and a third constant-current source I3 connected between the emitter of the NPN transistor Q10 and the ground potential terminal GND.

A feedback circuit 12 comprising resistors R2 and R1 and a capacitor C1 is connected between the output terminal OUT and a negative feedback terminal NF.

Q1 and Q2 designate NPN transistors, the emitters of which are connected together, and which therefore form a differential pair. These transistors have their collectors connected to the collectors of the transistors Q4 and Q5, respectively, and their emitters connected to each other. A second constant-current source I2 is coupled between the emitter node of the transistors Q1 and Q2 and the ground potential terminal GND. The base of the transistor Q1 is coupled to the negative feedback terminal NF (i.e., the node of the resistors R2 and R1 of the feedback circuit 12). A reference voltage $V_{REF}$ is applied to the base of the transistor Q2.

The transistors Q1 and Q2 and the second constant current source I2 constitute a feedback amplifier $GM_{NF}$. The resistors R3 to R8 and the transistor Q3 to Q9 constitute the adder circuit 10. The emitter follower circuit, which comprises the transistor Q10 and the third constant-current source I3, is the current-to-voltage converting circuit 11.

In the amplifier circuit described above, the switch SW selects the emitter node of one of the input transistor pairs (QA1, QB1), (QA2, QB2), ... (QAn, QBn), and connects the selected emitter node to the variable constant-current source I1. As a result of this, the transistor pair, the emitter node of which has been selected, i.e., the input amplifier formed of this pair, is selected.

The transfer conductance gmi (i=1 to n) of the selected amplifier is:

$$gmi = I1/(2 \cdot VT) \qquad (2)$$

where VT is thermal voltage.

The transfer conductance $gm_{NF}$ of the feedback amplifier $GM_{NF}$ is:

$$gm_{NF} = I2/(2 \cdot VT) \qquad (3)$$

The current-to-voltage conversion gain K and feedback ratio $\beta$ of the amplifier circuit is as follows, assuming that the NPN transistor Q10 has a current amplification factor $h_{FE}$:

$$K = h_{FE}(R1 + R2) \qquad (4)$$

$$\beta = R1/(R1 + R2) \qquad (5)$$

Hence, the amplifier circuit having a switch, which is illustrated in FIG. 3, has a gain GV given by:

$$GV = gmi/\{(1/K) + \beta \cdot gm_{NF}\} \qquad (6)$$
$$= \frac{\{I1/(2 \cdot VT)\}}{\{1/h_{FE} \cdot (R1 + R2)\} + \{I2/(2 \cdot VT)\} \cdot R1/(R1 + R2)}$$

The input amplifier selected and connected to the variable constant-current source I has, for the input signal, gain GV defined by equation (6). By contrast, the any other input amplifier, which is not selected and not connected to the variable constant-current source I1, has a transfer conductance gm of "0" and a gain GV of "0." Hence, only the signal input to the selected input amplifier is amplified and output from the amplifier circuit; the signal input to any not selected input amplifier is not output at all. The circuit of FIG. 3 therefore functions an amplifier circuit with a switch.

The input amplifiers GM1 to GMn can have different gains GV for input signals, respectively, merely by varying the currents from the variable constant-current source I1 to the input amplifiers GM1 to GMn.

The DC potential at the output of the amplifier circuit is equal to the reference voltage $V_{REF}$ which is applied to the feedback amplifier circuit $GM_{NF}$.

Further, when the switch SW selects none of the input amplifiers GM1 to GMn, the gain GV is "0," and the input signal does not appear in the output. Hence, the amplifier circuit is set in the mute mode. While the circuit remains in the mute mode, the DC output potential of the circuit is equal to the reference voltage $V_{REF}$ applied to the feedback amplifier $GM_{NF}$.

Figure 4:
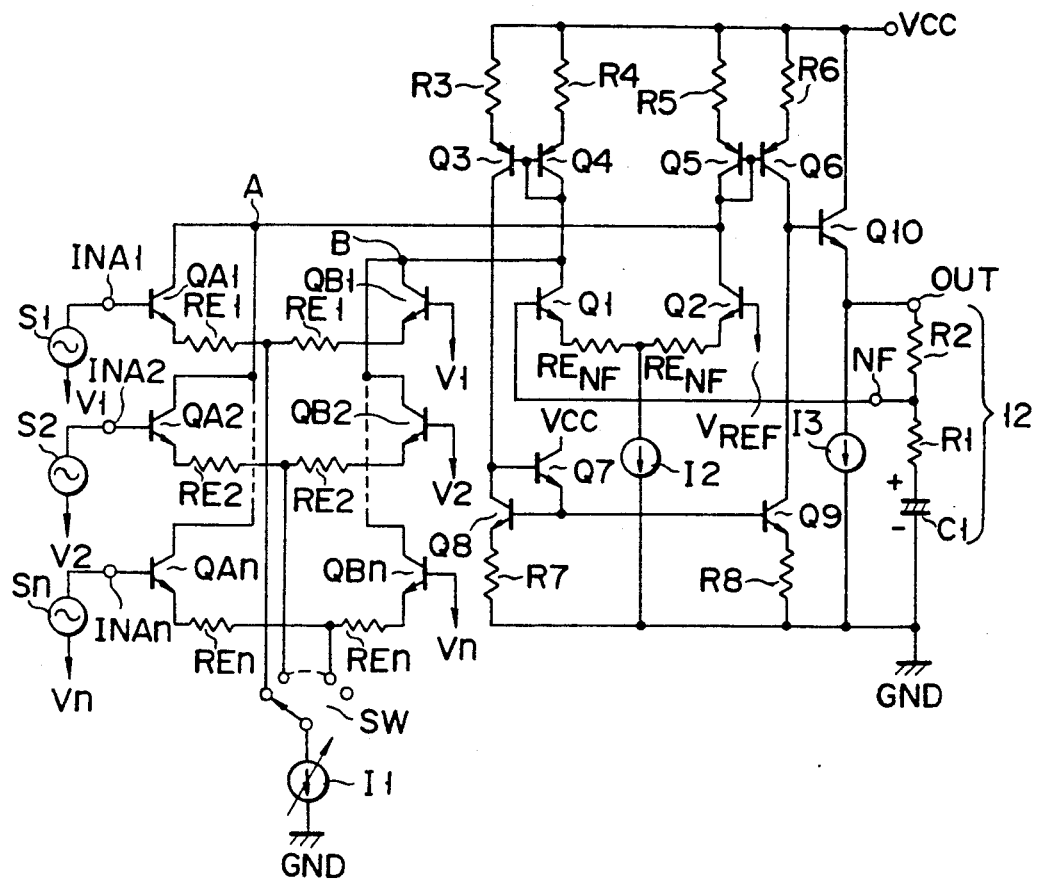
FIG. 4 is a circuit diagram showing another embodiment of the amplifier circuit shown in FIG. 2.

FIG. 4 illustrates another embodiment of this invention, which is identical to the circuit shown in FIG. 3, except for the following respects. First, the emitter of the input transistors of each pair, i.e., (QA1, QB1), (QA2, QB2), ... or (QAn, QBn), have their emitters connected together by two resistors REi (i=1to n). Second, the emitters of NPN transistors Q1 and Q2 are connected to each other by two resistors $RE_{NF}$. Therefore, in FIG. 4, the same symbols designate the components identical to those shown in FIG. 3.

In the amplifier circuit with a switch, shown in FIG. 4, the transfer conductance gmi (i=1 to n) of the amplifier selected by operating the switch SW is:

$$gmi = 1/\{(2 \cdot VT/I1) + REi\} \quad (7)$$

The transfer conductance $gm_{NF}$ of the feedback amplifier $GM_{NF}$ is:

$$gm_{NF} = 1/\{(2 \cdot VT/I1) + RE_{NF}\} \quad (8)$$

Hence, the gain GV of the amplifier circuit having a switch, which is illustrated in FIG. 4, is:

$$GV = gmi/\{(1/K) + \beta \cdot gm_{NF}\} \quad (9)$$

$$= \frac{1/\{(2 \cdot VT/I1) + REi\}}{[1/h_{FE} \cdot (R1 + R2)] + [\{R1/(R1 + R2)\}/\{(2 \cdot VT/I2) + RE_{NF}\}]}$$

The input amplifiers GM1 to GMn can have different gains GV for input signals, respectively, merely by imparting different resistances REi to the input amplifiers.

The amplifier circuit of FIG. 4 has a broad dynamic range, and can reduce the restrictions on the input signal. This is because an emitter resistor REi is incorporated in each of the input amplifier circuits GM1 to GMn.

As has been described, the present invention can provide an amplifier circuit having a switch, which comprises a small number of elements, which can have a gain individually set for each input signal, and which can operate in mute mode without requiring mute-mode transistors.

INDUSTRIAL APPLICABILITY

Because of the advantages described above, the amplifier circuit having a switch, according to the invention, is useful in the case where it is required that the circuit have a high integration density, have a gain individually set for each of the input signals, or have no mute-mode transistors.

I claim:

1. An amplifier circuit having a plurality of input voltage-to-current converting amplifiers, each having two input terminals, one of which is coupled to an input-signal source having a DC potential source, and the other of which is connected to the DC potential source, said input amplifiers having output terminals connected together, and having applied thereto different DC voltages from the DC potential source, said amplifier circuit comprising:

an adder circuit having two input terminals, one of which is connected to receive the current output flowing from a node of the output terminals of the input voltage-to-current converting amplifiers;

an additional current-to-voltage converting amplifier connected to receive the current output by said adder circuit, for converting the current into a voltage;

a feedback voltage-to-current converting amplifier circuit having two input terminals, one of which is connected to receive an output applied from said additional current-to-voltage converting amplifeir through a feedback circuit, and the other of which is connected to receive a reference potential, for generating and supplying a current to the other input terminal of said adder circuit; and a switch circuit for selecting and connecting one of said input voltage-to-current amplifiers to an operation current source.

2. The amplifier circuit according to claim 1, wherein said operation current source is a variable current source.

3. The amplifier circuit according to claim 1 or claim 2, wherein said feedback voltage-to-current converting amplifier comprises bipolar transistors forming a differential pair having collectors connected to said adder circuit, and emitters connected together by resistors, forming an emitter node connected to a constant current source.

* * * * *

UNITED STATES PATENT AND TRADEMARK OFFICE
CERTIFICATE OF CORRECTION

PATENT NO. : 5,148,121
DATED : September 15, 1992
INVENTOR(S) : Noriaki Uchida

It is certified that error appears in the above-identified patent and that said Letters Patent is hereby corrected as shown below:

```
Claim 1, column 8, line 24, change "amplifeir"
to --amplifier--.
```

Signed and Sealed this

Ninth Day of November, 1993

Attest:

BRUCE LEHMAN

Attesting Officer     Commissioner of Patents and Trademarks